(12) United States Patent
Jiang

(10) Patent No.: US 12,739,967 B2
(45) Date of Patent: Sep. 15, 2026

(54) CORE RESONANCE SUPPRESSION IN SIGNAL INTEGRITY OPTIMIZED PACKAGE

(71) Applicant: Avago Technologies International Sales Pte. Limited, Singapore (SG)

(72) Inventor: Kun Jiang, Timnath, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 322 days.

(21) Appl. No.: 18/362,518

(22) Filed: Jul. 31, 2023

(65) Prior Publication Data

US 2025/0048535 A1 Feb. 6, 2025

(51) Int. Cl.
*H05K 1/02* (2006.01)

(52) U.S. Cl.
CPC ......... *H05K 1/0225* (2013.01); *H05K 1/0245* (2013.01); *H05K 1/0253* (2013.01); *H05K 2201/093* (2013.01); *H05K 2201/09727* (2013.01)

(58) Field of Classification Search
CPC .. H05K 1/0225; H05K 1/0245; H05K 1/0253; H05K 2201/093; H05K 2201/09727
USPC .......................................................... 333/238
See application file for complete search history.

(56) References Cited

U.S. PATENT DOCUMENTS 7,605,460 B1 10/2009 Wu et al.
2005/0247482 A1* 11/2005 Nakamura ............. H05K 1/115 174/262
2007/0273026 A1* 11/2007 Tien ........................ H01L 23/64 257/E23.021
2017/0278806 A1 9/2017 Kuo et al.
2023/0141318 A1 5/2023 Hwang et al.

OTHER PUBLICATIONS

Extended European Search Report, European Application No. 24191125.4 dated Feb. 25, 2025, 10 pages.

* cited by examiner

*Primary Examiner* — Andrea Lindgren Baltzell
*Assistant Examiner* — Abigail Amir Yaldo
(74) *Attorney, Agent, or Firm* — King Intellectual Asset Management

(57) ABSTRACT

A signal integrity optimized package is provided. An apparatus includes a core comprising a top surface, bottom surface, and a first plane coupled to the top surface of the core. The first plane includes a first region circumscribed by a first ditch, wherein the first region includes an electrically conductive material, and wherein the first ditch is configured to electrically isolate the first region.

20 Claims, 4 Drawing Sheets

200A

205

210

215

AGND

AGND

CORE RESONANCE SUPPRESSION IN SIGNAL INTEGRITY OPTIMIZED PACKAGE

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for a signal integrity optimized semiconductor package.

BACKGROUND

Serializer/deserializer (SerDes) ICs continue to support increasing data rates. At planned 200G (e.g., 224 gigabits per second (Gbps)) data rates, the Nyquist frequency of such applications is 56 gigahertz (GHz). Conventional packages with 1440 micrometer (μm) core thickness have known core resonances in the range of approximately 47-49 GHz. As a result, signal integrity performance may be degraded at the expected data rates for 200G SerDes applications. Similar issues may arise with other combinations of data rates and package thicknesses, where package resonances may affect signal integrity performance of the IC.

Thus, methods, systems, and apparatuses for a signal integrity optimized semiconductor package are provided.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

FIG. 2A is a schematic diagram of a cross-section of the top layer of a signal integrity optimized package, in accordance with various embodiments;

FIG. 2B is a schematic diagram of a cross-section of the inner layer of a signal integrity optimized package, in accordance with various embodiments.

DETAILED DESCRIPTION OF EMBODIMENTS

Figure 1A:
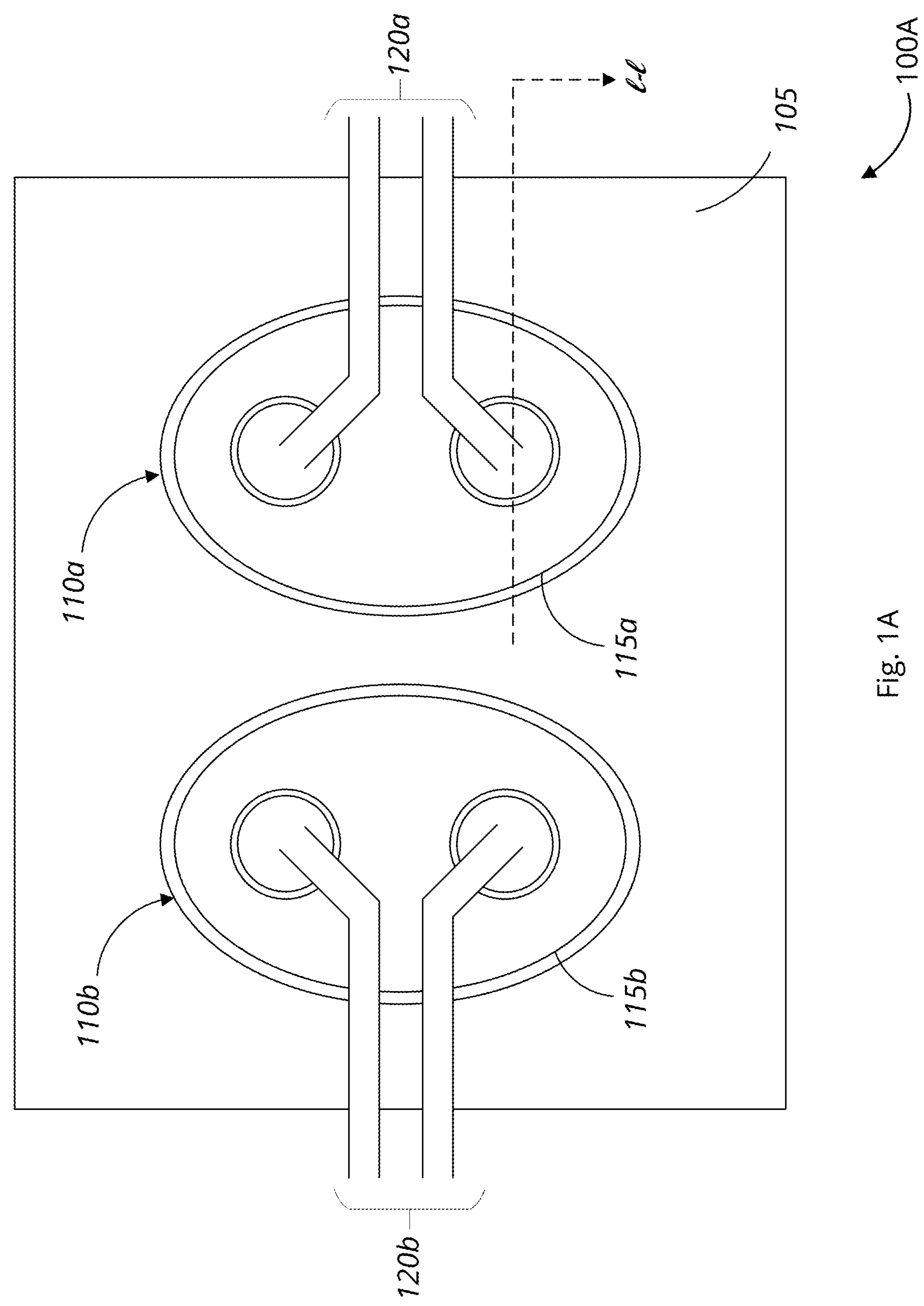
FIG. 1A is a schematic top view of a top layer of a signal integrity optimized package, in accordance with various embodiments.

Various embodiments set forth a signal integrity optimized package.

In some embodiments, an apparatus for a signal integrity optimized package is provided. The apparatus includes a core having a top surface, bottom surface, and a first plane coupled to the top surface of the core. The first plane includes a first region circumscribed by a first ditch, wherein the first region includes an electrically conductive material, and wherein the first ditch is configured to electrically isolate the first region.

In further embodiments, a semiconductor package optimized for signal integrity and resonance suppression is provided. The semiconductor package includes a core comprising a top surface and bottom surface, wherein the core is formed of a dielectric material, and one or more first planes coupled to the top surface of the core. Each first plane of the one or more first planes includes a respective first region circumscribed by a respective first ditch, wherein each respective first region includes an electrically conductive material, and wherein each respective first ditch is configured to electrically isolate the respective first region.

In further embodiments, a signal integrity optimized package substrate is provided. The substrate includes a dielectric core comprising a top surface and bottom surface, and a first ground plane coupled to the top surface of the dielectric core. The first ground plane includes a first ground island circumscribed by a first ditch, wherein the first ditch is configured to electrically isolate the first ground island from other areas of the first ground plane.

In the following description, for the purposes of explanation, numerous details are set forth to provide a thorough understanding of the described embodiments. It will be apparent to one skilled in the art, however, that other embodiments may be practiced without some of these details. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

When an element is referred to herein as being “connected” or “coupled” to another element, it is to be understood that the elements can be directly connected to the other element, or have intervening elements present between the elements. In contrast, when an element is referred to as being “directly connected” or “directly coupled” to another element, it should be understood that no intervening elements are present in the “direct” connection between the elements. However, the existence of a direct connection does not exclude other connections, in which intervening elements may be present.

When an element is referred to herein as being “disposed” in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being “disposed directly” relative to another element, it should be understood that no intervening elements are present in the “direct” example. However, the existence of a direct disposition does not exclude other examples in which intervening elements may be present.

Likewise, when an element is referred to herein as being a “layer,” it is to be understood that the layer can be a single layer or include multiple layers. For example, a conductive layer may comprise multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

Conventional packages with 1440 μm core thickness exhibit a core resonance in the 47-49 GHz range. The resonance of the package core can interfere with the operation of 200G SerDes ICs with data rates up to 224 Gbps, given the Nyquist frequency of 56 GHz. The core resonance may be attributed to the large ground planes disposed at both sides of the core (e.g., top of the core and bottom of the core), creating a plane resonance that impacts package performance from insertion loss and crosstalk. Thus, the signal integrity optimized package mitigates the core resonance by changing the shape of an analog ground (AGND) plane, and further providing isolation of any plane resonance.

FIG. 1A is a schematic top view of a top layer of a signal integrity optimized package (hereinafter "package layer 100A"), in accordance with various embodiments. The package layer 100A includes a ground plane 105, first ditch 110*a*, second ditch 110*b*, first ground island 115*a*, second ground island 115*b*, first signal pair 120*a*, and second signal pair 120*b*. It should be noted that the various parts and components of package layer 100A are schematically illustrated in FIG. 1A, and that modifications to the various components and other arrangements of package layer 100A may be possible and in accordance with the various embodiments.

In various embodiments, the package layer 100A may be include a ground plane 105 in which respective ditches 110*a*, 110*b* and ground islands 115*a*, 115*b* are formed. Accordingly, the package layer 100A may be a metal layer that is electrically coupled to ground, such as an analog ground (e.g., a signal ground for analog signals in a given circuit). In some examples, the package layer 100A, and specifically the ground plane 105, may be formed from copper (Cu), such as copper foil. As used herein, a ground island may refer to a localized ground, electrically isolated from the larger ground plane, such as ground plane 105, via a ditch, such as ditch 110*a*, 110*b*. The ground island may be a metal layer that is connected, for example, to an analog ground or other ground, and generally has a smaller footprint than a ground plane. In some examples, the ground island is a region (interchangeably referred to as a "ground island region") formed from a larger ground plane 105, via the ditching process, as will be described in greater detail below.

In various examples, the ground islands 115*a*, 115*b* may be formed via a ditching process which forms ditches 110*a*, 110*b*. Accordingly, as depicted, the ditches 110*a*, 110*b* circumscribing the respective ground islands 115*a*, 115*b*. In some examples, the borders of the respective ground islands 115*a*, 115*b* may be defined, at least in part, by the shape of the respective ditch 110*a*, 110*b*.

For purposes of illustration, the ground islands 115*a*, 115*b* are depicted as a pair of elliptical structures. It is to be understood that the shape, size, and number of ground islands are not limited in the manner depicted, and that in other embodiments, other types of ground island shapes and sizes, and other numbers of ground islands may be possible. By forming the ground islands 115*a*, 115*b* in the ground plane 105, the large surface area of the ground plane may be broken up by ditches 110*a*, 110*b*, thus changing any plane resonances created by stacked layers of ground planes. Moreover, due to the structure of the island, any existing plane resonances in the ground plane 105 are isolated from ground islands 115*a*, 115*b* by the ditches 110*a*, 110*b* circumscribing respective ground island 115*a*, 115*b*.

In some examples, a size and/or shape of a respective ground island, such as the first and second ground islands 115*a*, 115*b*, may be determined, at least in part, based on a plane resonance with at least one other ground plane (e.g., another package layer). Plane resonance may be given by the following formula:

$$f_{mnp} = \frac{c}{2\sqrt{\varepsilon_r \mu_r}} \sqrt{\left(\frac{m}{a}\right)^2 + \left(\frac{n}{b}\right)^2 + \left(\frac{p}{h}\right)^2} \qquad \text{Eq. (1)}$$

Where c is the speed of light, $\varepsilon_r$ is the dielectric constant, $\mu_r$ is magnetic permeability, a, b, and h are the dimensions of the cavity formed between two ground planes, and m, n, and p, correspond to resonant modes.

Accordingly, by forming ground islands 115*a*, 115*b* via ditching, the plane resonance may be altered by changing the size of the cavity formed between any two layers (e.g., between ground islands on separate package layers). In some examples, the ditch may have a width of 50 μm, which is a distance by which the ground island 115*a*, 115*b* is separated from the rest of the ground plane 105. In some embodiments, ditches, such as the first and second ditches 110*a*, 110*b*, may be formed via etching. In other examples, other techniques may be utilized, including, without limitation, lithography, grinding, drilling, cutting, or other suitable process. In some embodiments, the ditches 110*a*, 110*b* may be filled with a dielectric material (e.g., dielectric material deposited into the ditch). In some examples, the ditch 110*a*, 110*b* may be filled, for example, with a buildup material, such as GL103, GL107, FR-4, or FR-5. In other examples, other materials such as an epoxy, resin, or other dielectric material may be utilized. In yet further examples, the ditch may remain unfilled.

In various embodiments, the package layer 100A may be disposed directly above at least one other ground layer (e.g., a package layer that includes a ground plane) of the signal integrity optimized package. In some examples, the package layer 100A is a layer disposed above a package core (e.g., a dielectric core), commonly referred to as an "FC" layer (e.g., FC1, FC2, etc.). In the example depicted, the package layer 100A may be a ground layer (FC2) that is disposed above ground layer (FC1), where FC1 is disposed on a top surface of the package core. In contrast, as will be described in greater detail below with respect to FIG. 1B, a package layer that is disposed below the dielectric core may be referred to as a "BC" layer (e.g., BC1, BC2, BC3, BC4, etc.). As used herein, a "ground layer" is used to refer to a layer of the package that includes a ground plane, as separate from a ground island. However, it is to be understood that a ground plane may itself be a layer of the package, and that a ground island may itself be a smaller, localized ground plane. Accordingly, the skilled artisan will appreciate that packages in accordance with various embodiments can include multiple planes, including without limitation ground planes; for example FC1 can include a first plane and BC1 (described in further detail below) can include a second plane, each of which happens to be a ground plane.

In various embodiments, the package layer 100A further includes respective signal pairs 120*a*, 120*b*. Signal pairs 120*a*, 120*b* may be signal lines configured to carry the signals of the SerDes IC, through the ground layer(s), to a ball grid array (BGA), through-hole via (such as a plated through-hole (PTH) via, through-silicon via (TSV), etc.), or other interconnect structure. Interconnect, as used herein, may refer to structures used to carry the signal from one circuit (or part of the circuit) to another circuit (or other part of the circuit). Suitable interconnects may include, without limitation, conductive traces, microstrips, pads, routing layers, through-hole vias, BGAs, etc. In various examples, the signal pairs 120*a*, 120*b* may pass through the package layer 100A through respective cutouts in the respective ground islands 115*a*, 115*b*.

Figure 1B:
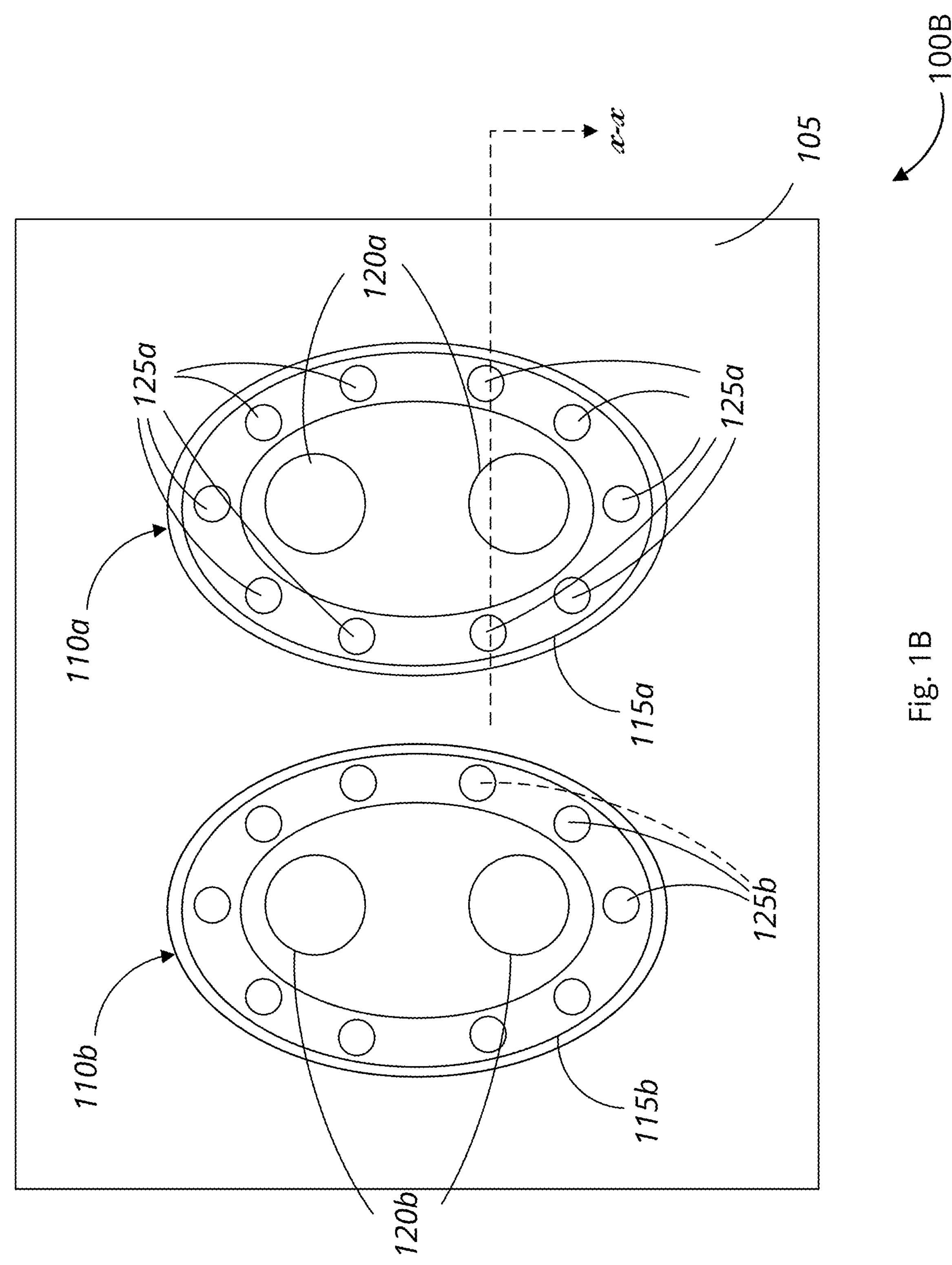
FIG. 1B a schematic top view of an inner layer of a signal integrity optimized package, in accordance with various embodiments.

FIG. 1B is a schematic top view of an inner layer 100B of a signal integrity optimized package (hereinafter "package layer 100B"), in accordance with various embodiments. The package layer 100B includes a ground plane 105, first ditch 110*a*, second ditch 110*b*, first ground island 115*a*, second ground island 115*b*, first signal pair 120*a*, second signal pair 120*b*, first plurality of through-hole vias 125*a*, and second plurality of through-hole vias 125*b*. It should be noted that the various parts and components of package layer 100B are schematically illustrated in FIG. 1B, and that modifications to the various components and other arrangements of package layer 100B may be possible and in accordance with the various embodiments.

Like package layer 100A of FIG. 1A, in various embodiments, the package layer 100B may be a ground layer having a ground plane 105 in which respective ditches 110*a*, 110*b* and ground islands 115*a*, 115*b* are formed. In contrast with the package layer 100A, package layer 100B includes ground islands 115*a*, 115*b* that take the form of a ring, with a hollow/empty center. The ground islands 115*a*, 115*b* may be formed via a ditching process which forms ditches 110*a*, 110*b*. In some examples, the borders of the respective ground islands 115*a*, 115*b* may be defined, at least in part, by the shape of the respective ditch 110*a*, 110*b*. The center of the ground islands 115*a*, 115*b* may be hollow, and further allow signal pairs 120*a*, 120*b* to pass through the opening in the center of the ground islands 115*a*, 115*b*.

For purposes of illustration, the ground islands 115*a*, 115*b* are depicted as a pair of elliptical rings. It is to be understood that the shape, size, and number of ground islands are not limited in the manner depicted, and that in other embodiments, other types of ground island shapes and sizes, and other numbers of ground islands may be possible. In some embodiments, as previously described, the ditches 110*a*, 110*b* may be filled with a dielectric material (e.g., dielectric material deposited into the ditch), such as an epoxy, resin, or other dielectric material. In other examples, the ditch may remain unfilled.

In various embodiments, the package layer 100B may be disposed above and/or below a core of the signal integrity optimized package (as will be described in greater detail below with respect to FIG. 3), and below a ground layer having the configuration of package layer 100A. Specifically, in one example, the core may include a top surface, bottom surface, and four side walls. Thus, the package layer 100B may be disposed above the top surface of the core, between the top surface of the core and below package layer 100A, and/or below the bottom surface of the core. In some examples, the package layer 100B is disposed below at least one other ground layer (e.g., a package layer that includes a ground plane, such as package layer 100A) of the signal integrity optimized package. In some examples, the package layer 100B is a layer disposed above a package core (e.g., a dielectric core), commonly referred to as an FC layer (e.g., FC1, FC2, etc.). In the example depicted, the package layer 100B may be a ground layer (FC1) that is disposed below ground layer (FC2), where FC1 is disposed on a top surface of the package core.

In further embodiments, the package layer 100B may be a package layer that is disposed below the dielectric core, referred to as a "BC" layer (e.g., with reference to FIG. 3: one of BC1, BC2, BC3, BC4). Thus, in some examples, the package layer 100B is a ground layer disposed directly below the core and/or below another ground layer that is directly below the core (e.g., BC2-BC4). For example, in some embodiments, the package layer 100B may be a ground layer disposed directly below the core (e.g., BC1). Subsequent ground layers (e.g., BC2-BC4) may have similar "ring-shaped" ground islands 115*a*, 115*b*. In other examples, the subsequent ground layers (e.g., BC2-BC4) may include ground islands 115*a*, 115*b* having differently shaped rings (e.g., with a hollow center, but with a differently shaped "ring"). For example, the "ring" may be wider on one side relative to an opposite side, have an irregular contour, etc.

In various embodiments, the package layer 100B further includes respective signal pairs 120*a*, 120*b*. Signal pairs 120*a*, 120*b* pass through the center of the respective ground islands 115*a*, 115*b* to a BGA or other interconnect structure as previously described.

In various embodiments, the first and second ground islands 115*a*, 115*b* may respectively include a plurality of through-hole vias, such as the first plurality of through-hole vias 125*a*, and second plurality of through-hole vias 125*b*. In some examples, the respective plurality of through-hole vias 125*a*, 125*b* may be PTH vias. In other examples, the respective ground islands 115*a*, 115*b* are not limited to including a plurality of PTH vias, and may instead include one or more through-hole vias (e.g., a single through-hole via, or more than one through-hole via, etc.). In various examples, the through-hole vias 125*a*, 125*b* may be coupled to one or more interconnect structures, as previously described.

Figures 2A, 2B:
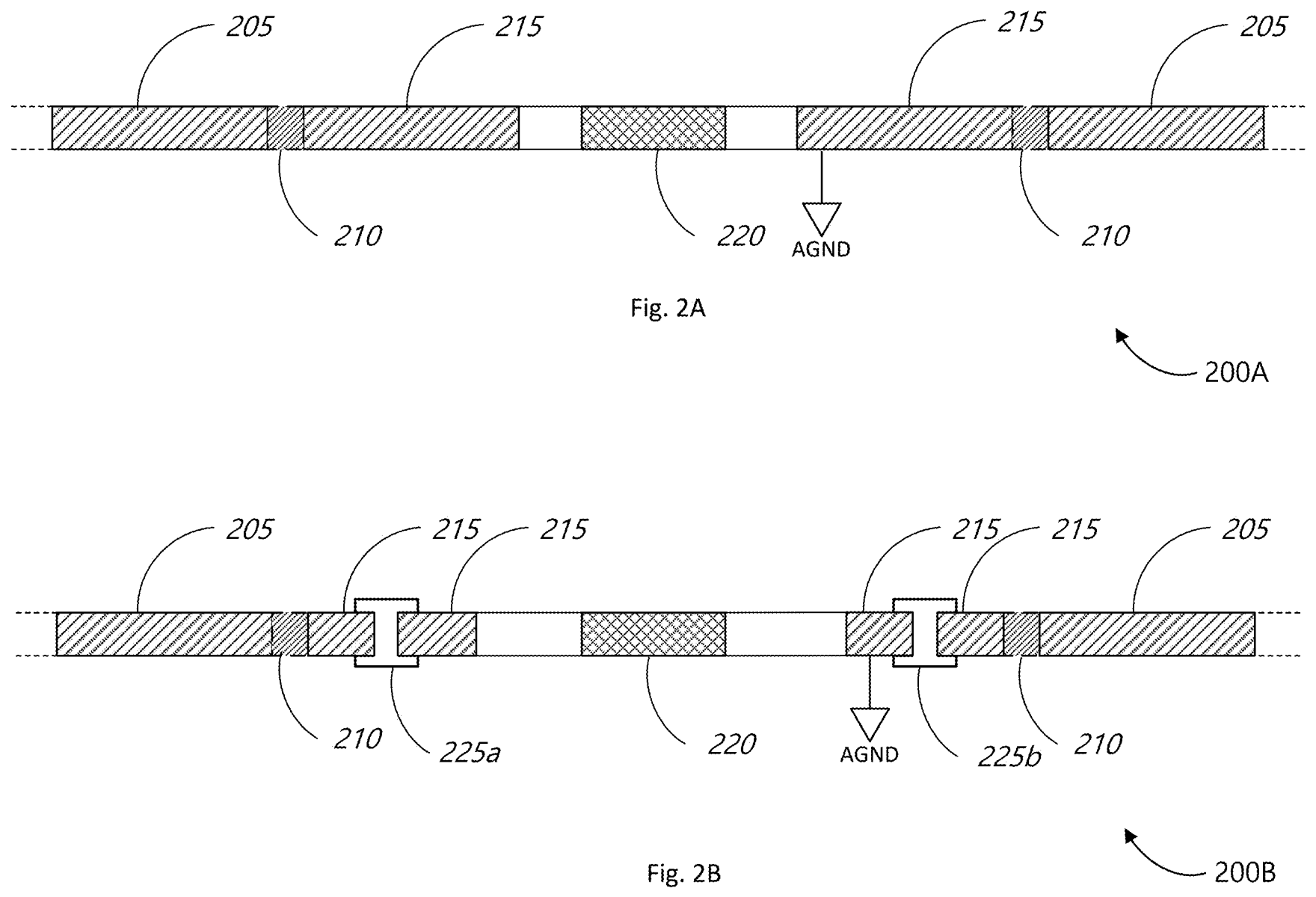

FIG. 2A is a schematic diagram of a partial cross-section of the package layer 100A, 200A taken across line l-l, in accordance with various embodiments. The cross-sectional view of package layer 200A shows the different structures described above, but obscured in the top view, and shows only part of the ground plane and a cross section of a single ground island of the package layer 100A. Specifically includes ground plane 205, ditch 210, ground island 215, and signal line 220 of a respective signal pair (120*a* or 120*b*). It should be noted that the various parts and components of package layer 200A are schematically illustrated in FIG. 2A, and that modifications to the various components and other arrangements of package layer 200A may be possible and in accordance with the various embodiments.

As shown in the cross-sectional view, ditch 210 may be filled with a dielectric material, as described above. In some examples, the area (e.g., a cutout in the ground island 215, 115*a*, 115*b*) around the signal line 220 may similarly be filled with a dielectric material, or alternatively, remain unfilled.

FIG. 2B is a schematic diagram of a partial cross-section of the package layer 100B, 200B taken across line x-xl, in accordance with various embodiments. The cross-sectional view of package layer 200B shows the different structures described above, but obscured in the top view, and shows only part of the ground plane and a cross section of a single ground island of the package layer 100B. Accordingly, package layer 200B includes ground plane 205, ditch 210, ground island 215, signal line 220 of a respective signal pair (120*a* or 120*b*), and one or more through-hole vias 225*a*, 225*b*. It should be noted that the various parts and components of package layer 200B are schematically illustrated in FIG. 2B, and that modifications to the various components and other arrangements of package layer 200B may be possible and in accordance with the various embodiments.

In contrast with the cross-section of package layer 200A, the ground island 215 of package layer 200B includes one or more through-hole vias 225*a*-225*b*, and further takes the form factor of a ring, where the ground island 215 regions are thinner (e.g., less wide) than corresponding regions in package layer 200A. Accordingly, the cutout regions around the signal line 220 are also wider, corresponding to the hollow center of the ground island 215, whereas package layer 200A has a solid center. In further examples, as depicted, the one or more through-hole vias 225*a*, 225*b* may be a PTH via, in which the via may be plated with a metal (e.g., Cu plated).

Accordingly, in various embodiments, when package layers 100B, 200B are stacked, the ground island 215, ditch 210, one or more through-hole vias 225*a*-225*b*, and signal line 220 may be aligned so as to reduce the volume of any resonant cavity formed between an of the ground layers. The stacked layers of the signal integrity optimized package are described below with respect to FIG. 3.

Figure 3:
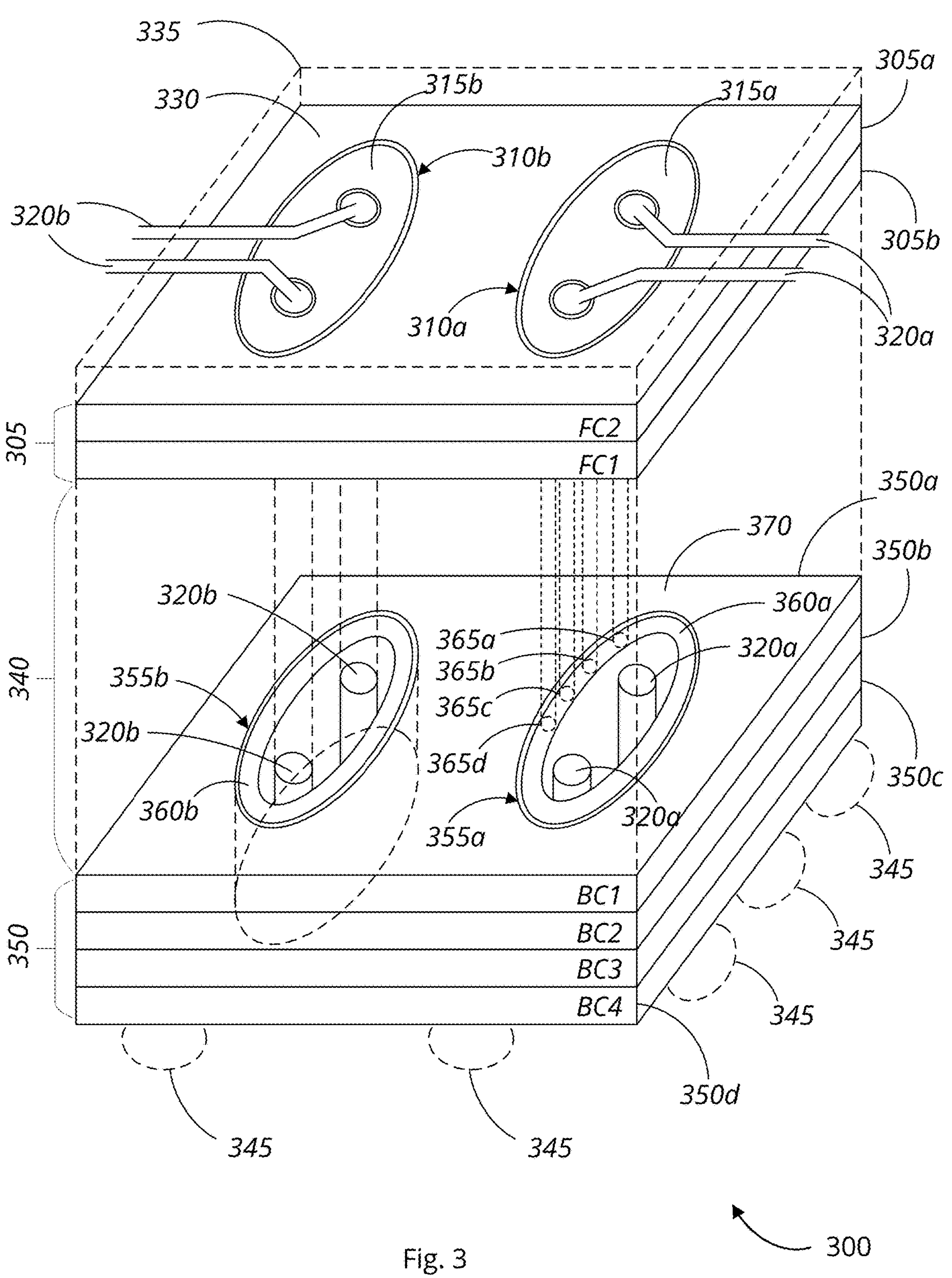
FIG. 3 is a schematic perspective view of a signal integrity optimized package, in accordance with various embodiments.

FIG. 3 is a schematic perspective view of a signal integrity optimized package 300 (hereinafter "package 300"), in accordance with various embodiments. The package 300 includes a first set of ground layers 305, which includes a top FC layer (FC2) 305*a* and bottom FC layer (FC1) 305*b*, core 340, second set of ground layers 350 including a first BC layer (BC1) 350*a*, second BC layer (BC2) 350*b*, third BC layer (BC3) 350*c*, and fourth BC layer (BC4) 350*d*, and interconnect structure(s) 345. It should be noted that the various parts and components of package 300 are schematically illustrated in FIG. 3, and that modifications to the various components and other arrangements of package 300 may be possible and in accordance with the various embodiments.

In various embodiments, the top FC layer, FC2 305*a*, is a ground layer as previously described with respect to the package layer 100A of FIG. 1A. Accordingly, the FC2 305*a* includes a respective first ditch 310*a*, second ditch 310*b*, first ground island 315*a*, second ground island 315*b*, and first signal pair 320*a* and second signal pair 320*b*, and ground plane 330. The bottom FC layer, FC1 305*b*, is a ground layer as previously described with respect to package layer 100B of FIG. 1B. Accordingly, FC1 305*b* may include a respective first and second ditch (not shown) and respective first and second ground islands (not shown). In contrast with FC1 305*a*, the first and second ground islands of FC2 305*b* may have the shape of a ring, and further include one or more through-hole vias 365*a*-365*d*, as visible with respect to the ground island 360*a* of BC1 350*a*.

Core 340 may be a dielectric core of the package 300. Accordingly, the core may include one or more dielectric layers, through which the one or more through-hole vias 365*a*-365*d*, and respective signal pairs 320*a*, 320*b* pass through. In various examples, the core 340 may be fully dielectric layers, in contrast with the ground layers 305, 350, which may be metal layers. In some examples, the dielectric material of the core 340 may include, without limitation, GL103, GL107, FR-4, FR-5, or other suitable core dielectric material. The core may include a top surface, bottom surface, and three or more side walls.

In the example depicted, the first set of ground layers 305 may be disposed on a top surface of the core 340, with the bottom FC layer, FC1 305*b*, disposed directly on the top surface of the core 340. The second set of ground layers 350 may be disposed below the bottom surface of the core 340, with the first BC layer, BC1 350*a* disposed directly below the bottom surface of the core 350 and including a ground plane 370.

In various embodiments, the BC1-BC4 350*a*-350*d* may be ground layers of the package 300, as previously described with respect to the package layer 100B of FIG. 1B. Accordingly, BC1 350*a* may include a respective first and second ditch 355*a*, 355*b* and respective first and second ground islands. 360*a*, 360*b* In contrast with FC1 305*a*, the first and second ground islands of FC2 305*b* may have the shape of a ring, and further include one or more through-hole vias 365*a*-365*d*, as visible with respect to the first ground island 360*a* of BC1 350*a*. Only a select number of through-hole vias 365*a*-365*d* are shown with respect to the first ground island 360*a* for purposes of visualization and clarity of the drawing. It is to be understood that the ground island 360*a* may include more (or less) than the depicted number of through-hole vias, the positions of which may also vary. Moreover, it is to be understood that in some embodiments, the second ground island 360*b* may also include one or more respective through-hole vias.

Moreover, in various embodiments, the subsequent BC layers, BC2-BC4 350*b*-350*d*, may respectively include the features described above with respect to BC1 350*a*. Accordingly, in various examples, the first and second ditches 355*a*-355*b* shown on BC1 350*a* are understood to extend through each BC layer 350*b*-350*d*, as shown in dashed line, through to the interconnect structure(s) 345. Accordingly, the one or more through-hole vias 365*a*-365*d* may pass through the respective ground island 360*a*, 360*b* of each of the second set of ground layers 350, to the interconnect structure(s) 345. Similarly, the respective signal pairs 320*a*, 320*b* may pass through the hollow center of the respective ground islands 360*a*, 360*b* of each of the second set of ground layers 350, to the interconnect structures 345.

In contrast with BC1 350*a*, the BC layers BC2-BC4 350*b*-350*d* may have a ring-shaped ground island (e.g., with a hollow/empty center) that is different in shape from the ring of BC1 350*a* and/or FC2 305*b*. Similarly, in further examples, the shape of the ground islands 360*a*-360*b* of BC1 350*a* may be different from the shape of the ground islands of FC2 305*b*. In some examples, the shape of a respective ground island 360*a*, 360*b* may be consistent through BC1-BC4 350*a*-350*d* (within the limits of manufacturing tolerances). In other examples, the size and shape of the ground island may be different at one or more of BC1-BC4 350*a*-350*d*. Moreover, in some embodiments, the first and second ground islands 360*a*, 360*b* may also differ from each other in size and shape.

In various embodiments, the package 300 is shown to include two FC layers, FC1 305*b* and FC2 305*a*, in the first set of ground layers 305, and four BC layers, BC1-BC4 350*a*-350*d*, in the second set of ground layers 350. It is to be understood, however, that in other embodiments, the first set of ground 305 may include more layers or less layers. Similarly, in other embodiments, the second set of ground layers 350 may include more layers or less layers. In yet further embodiments, the package 300 may include additional layers disposed above the first set of ground layers 305. For example, the package 300 may include additional layer 335 disposed above FC2 305*a*. In some examples, the additional layer 335 is a ground layer, as described above. In other examples, the additional layer 335 may be an active layer (which may include active elements, such as dies, logic, or other integrated circuits (ICs)), interposer, redistribution layer (RDL), or other type of package layer. In yet further examples, additional layers (not shown), as described above, may further be disposed before the second set of ground layers 350.

In various examples, the package 300 may further include interconnect structure(s) 345 disposed below the second set of ground layers 350. As previously described, the interconnect structure(s) 345 may include a BGA, solder balls, pads, or other suitable interconnect structures.

In experimental data, when compared to conventional ground planes, the signal integrity optimized package 300 exhibited no insertion loss resonance spike and a flattened a crosstalk spike. This is expected as the localized ground islands 315*a*, 315*b*, 360*a*, 360*b* isolate mitigate core resonances and further isolates any core resonance from the signal lines. Thus, in one implementation, plane resonance was shifted to 35 GHz, with a peak at −60 dB, compared to an approximately −20 dB peak at 48 GHz exhibited in conventional 1440 μm packages utilizing conventional ground planes. Accordingly, the package 300, set forth above, has been demonstrated experimentally to allow existing 1440 μm core packages to support 200G SerDes applications.

While some features and aspects have been described with respect to the embodiments, one skilled in the art will recognize that numerous modifications are possible. For example, the methods and processes described herein may be implemented using hardware components, custom integrated circuits (ICs), programmable logic, and/or any combination thereof. Further, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. An apparatus comprising:

a core comprising a top surface, bottom surface, and a first plane coupled to the top surface of the core, wherein the first plane is a ground plane comprising a first region circumscribed by a first ditch, wherein the first region comprises a first electrically conductive material, wherein the first ditch is configured to electrically isolate the first region, wherein the first plane comprises a second region circumscribed by a second ditch and comprising a second electrically conductive material, and wherein the second ditch is configured to electrically isolate the second region.

2. The apparatus of claim 1, wherein the first region is a ground island.

3. The apparatus of claim 1, wherein the first ditch is filled with a dielectric material.

4. The apparatus of claim 1, wherein the first region has an elliptical shape with borders defined by the first ditch.

5. The apparatus of claim 1, further comprising:

a second plane coupled to the bottom surface of the core, wherein the second plane comprises a third region circumscribed by a third ditch, wherein the third region comprises a third electrically conductive material, wherein the third ditch is configured to electrically isolate the third region.

6. The apparatus of claim 5, further comprising one or more additional ground planes disposed on the first plane, the one or more additional ground planes formed of a fourth electrically conductive material, each ground plane of the one or more ground planes comprising a respective additional region circumscribed by the first ditch.

7. The apparatus of claim 6, wherein the first electrically conductive material, the second electrically conductive material, and the third electrically conductive material are the same electrically conductive material.

8. The apparatus of claim 5, further comprising one or more through-hole vias, wherein the one or more through-hole vias is configured to couple the third region to the first region.

9. The apparatus of claim 5, wherein the third region is a ground Island.

10. A semiconductor package:

a core comprising a top surface and bottom surface, wherein the core is formed of a dielectric material; and one or more first ground planes coupled to the top surface of the core, wherein each first ground plane of the one or more first ground planes comprises a respective first region circumscribed by a respective first ditch, wherein each respective first region comprises a first electrically conductive material, wherein each respective first ditch is configured to electrically isolate the respective first region; and one or more second planes coupled to the bottom surface of the core, wherein each second plane of the one or more second planes comprises a respective second region circumscribed by a respective second ditch, wherein each respective second region comprises a second electrically conductive material, wherein each respective second ditch is configured to electrically isolate the respective second region.

11. The semiconductor package of claim 10, wherein each first region is a ground island.

12. The semiconductor package of claim 10, wherein each respective first region is coupled to an analog ground.

13. The semiconductor package of claim 10, wherein each respective first region has an elliptical shape with borders defined by the respective first ditch.

14. The semiconductor package of claim 10, wherein each respective first ditch is filled with a dielectric material.

15. The semiconductor package of claim 10, further comprising:

one or more through-hole vias, wherein each of the one or more through-hole vias is configured to connect a respective first region with a respective second region.

16. The semiconductor package of claim 10, wherein the first electrically conductive material and the second electrically conductive material are the same electrically conductive material.

17. A substrate comprising:

a dielectric core comprising a top surface and bottom surface;

a first ground plane coupled to the top surface of the dielectric core, wherein the first ground plane comprises a first ground island coupled to an analog ground and circumscribed by a first ditch, wherein the first ditch is configured to electrically isolate the first ground island from other areas of the first ground plane; and a second ground plane coupled to the bottom surface of the dielectric core, wherein the second ground plane comprises a second ground island circumscribed by a second ditch, wherein the second ditch is configured to electrically isolate the second ground island from other areas of the second ground plane.

18. The substrate of claim 17, wherein the first ground island has an elliptical shape with borders defined by the first ditch.

19. The substrate of claim 17, further comprising one or more through-hole vias, wherein the one or more through-hole vias is configured to couple the second ground island to the first ground island.

20. The substrate of claim 19, wherein the second ground island is coupled to the analog ground.

* * * * *